(12) United States Patent
Shafer et al.

(10) Patent No.: US 7,301,707 B2
(45) Date of Patent: Nov. 27, 2007

(54) PROJECTION OPTICAL SYSTEM AND METHOD

(75) Inventors: Dave Shafer, Fairfield, CT (US); Susanne Beder, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 11/219,594

(22) Filed: Sep. 1, 2005

(65) Prior Publication Data

US 2006/0056064 A1    Mar. 16, 2006

Related U.S. Application Data

(60) Provisional application No. 60/607,075, filed on Sep. 3, 2004.

(51) Int. Cl.
*G02B 3/00*    (2006.01)
(52) U.S. Cl. ........................................ 359/649; 359/754
(58) Field of Classification Search ........ 359/754–757, 359/763, 764, 784, 785
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,523,193 A | 6/1996 | Nelson | |
| 5,805,334 A * | 9/1998 | Takahashi | 359/364 |
| 5,982,558 A * | 11/1999 | Furter et al. | 359/649 |
| 6,445,510 B1 | 9/2002 | Schuster et al. | |
| 6,590,718 B2 | 7/2003 | Fürter et al. | |
| 6,646,718 B2 * | 11/2003 | Schuster et al. | 355/67 |
| 6,891,596 B2 | 5/2005 | Rostalski et al. | |
| 2003/0007253 A1 | 1/2003 | Schuster et al. | |
| 2005/0141098 A1 | 6/2005 | Schuster | |

FOREIGN PATENT DOCUMENTS

| | | |
|---|---|---|
| WO | WO 03/075049 A2 | 9/2003 |
| WO | WO 03/077036 A1 | 9/2003 |
| WO | WO 03/077037 A1 | 9/2003 |
| WO | WO 2005/054956 A2 | 6/2005 |

OTHER PUBLICATIONS

U.S. Appl. No. 60/526,096, filed Dec. 2, 2003, Rostalski et al.

* cited by examiner

*Primary Examiner*—Scott J. Sugarman
*Assistant Examiner*—Darryl J. Collins
(74) *Attorney, Agent, or Firm*—Jones Day

(57) ABSTRACT

A refractive projection optical system for imaging a first object into a region of a second object comprises a plurality of lenses disposed along an imaging beam path of the projection optical system; wherein the projection optical system is configured to have a numerical aperture on a side of the second object of greater than 1 wherein the projection optical system is configured to generate an intermediate image of the first object and to image the intermediate image into the region of the second object, wherein the intermediate image is formed in between, the first and second objects.

40 Claims, 5 Drawing Sheets

PROJECTION OPTICAL SYSTEM AND METHOD

BACKGROUND OF THE INVENTION

1. Field of the Invention

The present invention relates to a projection optical system, in particular an micro-lithographic projection optical system.

2. Brief Description of Related Art

Lithographic processes are commonly used in the manufacture of semiconductor elements, such as integrated circuits (ICs), LSIs, liquid crystal elements, micropatterned members and micromechanical components.

A projection exposure apparatus used for photolithography generally comprises an illumination optical system having a light source and a projection optical system. Light from the illumination optical system illuminates a reticle (a first object) having a given pattern, and the projection optical system transfers an image of the reticle pattern, onto a region of a photo-sensitive substrate (a second object). The image of the reticle pattern may also be reduced in size by the projection optical system so as to produce a smaller image of the reticle pattern on the substrate.

The trend to ever smaller and more sophisticated miniaturized devices places increasingly high demands on the projection exposure systems and thus projection optical systems used for the manufacture of these devices. In order to achieve higher resolutions in the exposure of substrates, the imaging of the reticle onto the substrate has to be performed with a sufficiently high numerical aperture (NA) on the side of the substrate. Therefore, an increase of the numerical aperture is a decisive factor in the development of improved projection exposure systems.

Projection exposure systems having a high numerical aperture are known from US 2003/0007253 A1 and WO 2003/075049 A2 and WO 2005/054956 A2 which documents are incorporated herein by reference.

Some conventional projection exposure systems are able to achieve a numerical aperture of greater than 1. One example of such projection exposure systems is referred to as a projection exposure system of the immersion type, known for example from WO 2003/077037 A1, which document is incorporated herein by reference. Another example of such projection exposure system is referred to as a projection exposure system of the near field exposure type or solid immersion type, known for example from WO 2003/077036 A1, which document is incorporated herein by reference.

High numerical apertures also bring about a whole range of challenges in terms of a design of the projection optical system. In purely refractive optical systems for projection exposure the requirements for correction of imaging errors, such as aberrations and the like, are increasing with increasing numerical aperture on an image side of the optical system. In addition to the demand for a well corrected wavefront, parameters such as a telecentricity on a reticle side need to be taken into account. These requirements are typically met by using aspherical lenses close to an image side of the projection optical system.

Projection optical systems tend to increase in weight and size as the numerical aperture of such systems increases.

In particular, diameters of lenses increase to such an extent that they become very expensive and difficult to manufacture, and the manufacture of aspherical lenses of a high diameter and a sufficient accuracy presents particular problems.

SUMMARY OF THE INVENTION

The present invention has been accomplished taking the above problems into consideration.

Embodiments of the present invention provide a projection optical system having a high numerical aperture and having a good imaging performance.

Further embodiments of the present invention provide a projection optical system having a high numerical aperture, wherein diameters of lenses used in the projection optical system can be maintained within an acceptable range.

Further embodiments of the present invention provide a projection optical system having a numerical aperture higher than 1 and having a good imaging performance.

Further embodiments of the present invention provide a projection optical system having a numerical aperture higher than 1, wherein diameters of lenses used in the projection optical system can be maintained within an acceptable range.

Further embodiments of the present invention provide an improved method of manufacturing a microstructured device and provide a microstructured device manufactured by such a method.

According to an exemplary embodiment of the present invention a refractive projection optical system for imaging a first object into a region of a second object comprises: a plurality of lenses disposed along an imaging beam path of the projection optical system; wherein the projection optical system is configured to have a numerical aperture on a side of the second object of greater than 1; wherein the projection optical system is configured to generate an intermediate image of the first object and to image the intermediate image into the region of the second object, wherein the intermediate image is formed in between the first and second objects.

In the context of the present invention, the term refractive optical system refers to systems where substantially all optical powers are provided by refractive lens elements. This is in contrast to a catadioptric optical system having at least one mirror providing a substantial amount of optical power. It is not excluded, however, that the refractive optical system according to the present invention comprises one ore more mirrors for folding the beam path through the system to reduce its size, provided that such mirror is sufficiently flat to provide substantially no optical power.

According to an exemplary embodiment of the invention the radius of curvature of the mirror of the refractive optical system is greater than $10^3$ m.

The present inventors have found that the concept of generating an intermediate image within the refractive optical system allows for an improved imaging quality at a high numerical aperture while maintaining free diameters of the lenses within an acceptable range.

The term intermediate image as used herein stands for a real intermediate image, as opposed to a virtual intermediate image.

The refractive optical system comprises a plurality of lenses. The plurality of lenses is dividable into a plurality of non-overlapping groups of lenses, such that a total refractive power of each group of lenses is one of a negative refractive power and a positive refractive power, and that a sum of the absolute values of the total refractive powers of the groups is a maximum value.

A lens, as used herein, relates to a single lens element and not to an optical system comprised of a plurality of lens elements.

A group of lenses, as used herein, may consist of a single lens only or more than one lens.

According to an exemplary embodiment, the intermediate image is formed in a region between two adjacent lens groups having positive refractive power, wherein one lens group of negative refractive power may be disposed between these two lens groups of positive refractive power.

According to an exemplary embodiment herein, a lens group of negative optical power and a further lens group of positive optical power is disposed between these two lens groups of positive refractive power and the second object.

According to a further exemplary embodiment herein, three lens groups of negative, positive and negative optical powers, respectively, are disposed between these two lens groups of positive refractive power and the first object.

According to a further alternative exemplary embodiment herein, four lens groups of positive, negative, positive and negative optical powers, respectively, are disposed between these two lens groups of positive refractive power and the first object.

According to an exemplary embodiment, the refractive optical system is of an immersion type, having a liquid having a refractive index of greater than one provided in between of the second object and a front lens of the plurality of lenses disposed closest to the second object. Such immersion liquid allows to achieve particular high values of the numerical aperture. As an example of an immersion liquid having a refractive index of greater than one distilled deionized water may be mentioned which has a refractive index of 1.44 at a wavelength of 193 nm.

According to an exemplary embodiment, the projection optical system has a numerical aperture that is greater than 1.1.

According to other exemplary embodiments, the projection optical system has a numerical aperture that is greater than 1.2 and in particular greater than 1.3.

According to exemplary embodiments, an imaging magnification of the optical system is less than 1.0, such that the image formed in the region of the second object is reduced in size as compared to the original provided by the first object.

In exemplary embodiments of the projection optical system, an absolute value of a magnification of the imaging of the intermediate image into the region of the second object is less than 0.5.

In further exemplary embodiments, an absolute value of a magnification of the imaging of the first object into the intermediate image is greater than 0.5.

In further exemplary embodiments, a ratio of a magnification of the imaging of the first object into the intermediate image over a magnification of the imaging of the intermediate image into the region of the second object is in a range of about 2 to 10. For example, the ratio may be in a range of about 2.5 to 4.5, or 3 to 10.

The choice of magnification of the imaging of the first object and the imaging of the intermediate image and their ratio may be used as a degree of freedom for achieving an improved design of the immersion type projection optical system.

In an exemplary embodiment of the present invention, the projection optical system is divided into two sub-systems: a first subsystem of lenses which is configured to generate a real intermediate image of the first object, and a second sub-system of lenses which generates a reduced size image of the intermediate image in a region of the second object. In particular in those embodiments, there are substantial deviations from telecentricity in a location of the intermediate image in the projection optical system. Such an embodiment is advantageous in that the second sub-system may be designed such that is generates a good wavefront and comprises only lenses having relatively small effective diameters since the parameters telecentricity and aberration are corrected for or determined, respectively, by the first sub-system, which generates an intermediate image at a magnification of about 1. Therefore, one group of imaging errors is corrected in the first sub-system whereas a different group of imaging errors is corrected for in the second sub-system, wherein a combination of the correction of both sub-system not only results in good imaging properties, but also allows a projection optical system having only lenses of a relatively small effective diameter.

The imaging of the first object into the intermediate image, in an exemplary embodiment, is such that at least one of the following conditions is fulfilled: an angle of at least one chief ray (as a measure for telecentricity) of the intermediate image is greater than 4°, a longitudinal spherical aberration of the intermediate image is greater than 0.8 mm, an astigmatism value of the intermediate image is greater than 11.0 mm, an aberration of the intermediate image is greater than 1.5%, a RMS (root mean square) of a spot diameter on an optical axis of the projection optical system is greater than 0.5 mm, a RMS of a spot diameter at a field point farthest away from the optical axis of the projection optical system is greater than 5 mm. In other words, in exemplary embodiments, an intermediate image is not telecentric, or is distorted, or is subject to spherical aberrations, or has coma, or has a chromatic error, or a combination thereof.

For example, in some exemplary embodiments, the imaging of the first object into the intermediate image is such that at least one of the following conditions is fulfilled: an angle of at least one chief ray of the intermediate image may be greater than 8°, in particular greater 15°, and in particular greater 25°; a longitudinal spherical aberration of the intermediate image may be greater than 0.9 mm, in particular 12 mm; an astigmatism value of the intermediate image may be greater than or equal to 20 mm, in particular 30 mm; an absolute value of an aberration of the intermediate image may be greater than 2%, in particular 8%; a RMS of a spot diameter on an optical axis of the projection optical system may be greater than 0.6 mm, in particular 1 mm; a RMS of a spot diameter at a field point farthest away from the optical axis of the projection optical system may be greater than or equal to 10 mm, in particular 16 mm.

According to an exemplary embodiment, a RMS (root mean square) deviation of a wavefront at the intermediate image is greater than 10 times a diffraction limit. The diffraction limit may be defined as $\lambda/NA$, wherein $\lambda$ is the wavelength of the light used for imaging and NA is the numerical aperture of the imaging at the intermediate image. For example, if it is assumed that the imaging is performed with spherical wavefronts emerging from the first object, the imaging wavefronts at the intermediate image will be distorted wavefronts deviating from the spherical shape, wherein an RMS value of such deviation may be greater than $10\lambda/NA$.

However, such aberration of wavefronts at the intermediate image is compensated for in the imaging of the intermediate image onto the second object. In exemplary embodiments of the invention, the RMS deviation at the second object may be less than $\lambda/(10\,NA)$, wherein NA is the numerical aperture of the imaging at the second object. According to further preferred exemplary embodiments of the invention, the RMS deviation of wavefronts at the second object may be less than $\lambda/(50\ NA)$.

According to further exemplary embodiments, the imaging from the first object into the second object is configured such that at least one, or all, of the following conditions is fulfilled: an angle of at least one chief ray of the image is less than 1°; a longitudinal spherical aberration of the image is less than 0.001 mm; an astigmatism value of the image is less than 100 nm; an aberration of the image is less than 0.001%; a RMS of a spot diameter on an optical axis of the projection optical system is less than 0.001 mm; a RMS of a spot diameter at a field point farthest away from the optical axis of the projection optical system is less than 0.002 mm; and a RMS deviation of a wave front is less than 0.1 times a diffraction limit.

In an exemplary embodiment, the projection optical system is rotationally symmetrical, i.e. the plurality of lenses are disposed along an optical axis of the projection optical system such that their centers are located on the optical axis.

In an exemplary embodiment, the projection optical system is free of a physical beam splitter, such as a semitransparent mirror.

In further exemplary embodiments, the intermediate image has a significant field curvature with a radius of curvature which is less than four times of its free diameter, in particular less than twice its free diameter or less than its free diameter.

The term design distance or design length as used herein stands for a distance between the first object and the second object in an operating or exposure mode, i.e. as foreseen by the design of the projection optical system when both the first and the second objects are in focus. If for example, a folded arrangement is used, the distance between the first object and the second object would be represented by a distance between a plane where the first object is disposed in and a plane where the second object is disposed in.

In an exemplary embodiment of the present invention, the design length L is greater than about 1100 mm or, preferably greater than about 1300 mm, wherein the embodiment is purely refractive.

Embodiments of immersion type projection optical systems generally allow to use lenses having a relatively small effective diameter. In exemplary embodiments of the immersion type projection optical system, an effective diameter of any lens of the plurality of lenses is smaller than 250 mm.

The refractive projection optical system having one intermediate image may be divided into lenses that generate the intermediate image, i.e. lenses in between the first object and a location of the intermediate image, and lenses that image the intermediate image, i.e. lenses that are disposed in between the location of the intermediate image and the second object. In exemplary embodiments of the present invention, effective diameters of the lenses that generate the intermediate image are preferably smaller than 220 mm, or effective diameters of the lenses that image the intermediate image are preferably smaller than 245 mm, or both.

In an exemplary embodiment of the present invention, the plurality of lenses of the projection optical system is dividable into nine non-overlapping groups of lenses, such that a total refractive power of a first group disposed closest to the first object is a positive refractive power; a total refractive power of a second group disposed directly adjacent to the first group is a negative refractive power; a total refractive power of a third group disposed directly adjacent to the second group is a positive refractive power; a total refractive power of a fourth group disposed directly adjacent to the third group is a negative refractive power; a total refractive power of a fifth group disposed directly adjacent to the fourth group is a positive refractive power; a total refractive power of a sixth group disposed directly adjacent to the fifth group is a negative refractive power; a total refractive power of a seventh group disposed directly adjacent to the sixth group is a positive refractive power; a total refractive power of an eighth group disposed directly adjacent to the seventh group is a negative refractive power; and a total refractive power of a ninth group disposed directly adjacent to the eighth group is a positive refractive power. The grouping of lenses is defined such that a sum of the absolute values of the total refractive powers of the first to ninth groups is a maximum value.

Such arrangement of lens groups in the projection optical system results in what would generally be referred to as having three waists. The waist indicates constrictions within the projection optical system. In an exemplary embodiment of the above arrangement of groups of lenses, a first waist is formed in a region of the fourth group of lenses, a second waist is formed in a region of the sixth group of lenses and a third waist is formed in a region of the eighth group of lenses.

It is preferred that the projection optical system comprises an aperture stop. In exemplary embodiments, the projection optical system comprises an aperture stop disposed between two lenses of the ninth group of lenses. In those embodiments, the ninth group of lenses consists of a first sub-group of lenses that is disposed in between the first object, or more precisely the eighth group of lenses, and the aperture stop and a second sub-group of lenses in between the aperture stop and the second object.

In alternative exemplary embodiments, the aperture stop may be disposed in any other group of lenses. Generally, the aperture stop may be disposed in a part of the projection optical system that is closer to the second object or a part of the projection optical system that is closer to the first object, with the former being preferred.

The aperture stop used in embodiments of the present invention may be adjustable. An example of such an aperture is described in U.S. Pat. No. 6,445,510.

Preferably, an effective diameter of any lens in a group of lenses having a total negative refractive power is equal to or smaller than an effective diameter of any lens in a group of lenses which in total has a positive refractive power and is disposed directly adjacent to the respective group of lenses having a total negative refractive power.

Further embodiments of the present invention provide an immersion type projection exposure system comprising an illumination optical system for generating a light beam of light, a mount for mounting a patterning structure as a first object, a substrate mount for mounting a radiation sensitive substrate as a second object, and the refractive projection optical system according to the first aspect of the present invention for imaging the patterning structure (first object) into a region of the radiation sensitive substrate (second object).

The term patterning structure as used herein refers broadly to any means suited for endowing an illuminating light beam with a patterned cross-section, an image of which pattern (of the illuminated patterning structure) is projected onto the substrate. The patterning structure may be a mask or a reticle, for example. Mask or reticle types include binary, attenuating and alternating phase shift types, and various hybrid types. The mask/reticle may transmit or reflect the illumination light beam whilst imparting a patterned cross-section upon it. Programmable mirror arrays are further examples of patterning structures suitable for use with the present invention. One example of such an array is described, for example, in U.S. Pat. No. 5,296,891. An additional example of a programmable mirror array is disclosed in U.S. Pat. No. 5,523,193. Programmable LCD arrays are further examples of patterning structures suitable for use with the present invention. Such an array is disclosed in U.S. Pat. No. 5,229,872, for example. Generally, light valves or illumination templates are additional terms used in connection with patterning structures.

In exemplary embodiments of the projection optical system the imaging beam has a wavelength of shorter than 250 nm, preferably shorter than 200 nm.

Further embodiments of the present invention provide a method of manufacturing a microstructured device, the method comprising: a first imaging of a patterning structure into an intermediate image of; and a second imaging of the intermediate image of the patterning structure into a region of a radiation sensitive substrate for exposing the radiation sensitive substrate; wherein the second imaging has a numerical aperture on a side of the radiation sensitive substrate of greater than one, and wherein the first imaging and the second imaging is performed by using a refractive projection optical system.

According to an exemplary embodiment, the imaging is performed using the refractive projection optical system as illustrated above.

According to an exemplary embodiment herein, the first imaging comprises: a first expanding of a cross section of an imaging beam downstream of the patterning structure; a first reducing of the cross section of the imaging beam downstream of the first expanding of the cross section; a second expanding of the cross section of the imaging beam downstream of the first reducing of the cross section; and a second reducing of the cross section of the imaging beam downstream of the second expanding of the cross section.

According to an exemplary embodiment herein, the first imaging further comprises: a third expanding of the cross section of the imaging beam downstream of the second reducing of the cross section; and a third reducing of the cross section of the imaging beam downstream of the third expanding of the cross section.

According to an exemplary embodiment herein, the second imaging comprises: a fourth expanding of the cross section of the imaging beam downstream of the intermediate image; a fourth reducing of the cross section of the imaging beam downstream of the fourth expanding of the cross section; a fifth expanding of the cross section of the imaging beam downstream of the fourth reducing of the cross section; and a fifth reducing of the cross section of the imaging beam downstream of the fifth expanding of the cross section; wherein the imaging beam is incident onto the radiation sensitive substrate downstream of the second reducing of the cross section.

According to further exemplary embodiments, the imaging of the projection optical system is colour corrected for only a comparatively narrow range of wavelengths adapted to the light source used for generating the radiation for producing the image. An example of such light source is an excimer laser.

According to an exemplary embodiment, the projection optical system is monochromatic. According to an exemplary embodiment herein, substantially all lenses of the projection optical system are made of a same lens material. An example of such lens material is quartz adapted for ultraviolet light applications (SILUV).

In a further aspect, the present invention also provides a microstructured device manufactured by the above method.

BRIEF DESCRIPTION OF THE DRAWINGS

The foregoing as well as other advantageous features of the invention will be more apparent from the following detailed description of exemplary embodiments of the invention with reference to the accompanying drawings. It is noted that not all possible embodiments of the present invention necessarily exhibit each and every, or any, of the advantages identified herein.

DETAILED DESCRIPTION OF EXEMPLARY EMBODIMENTS

Figure 1:
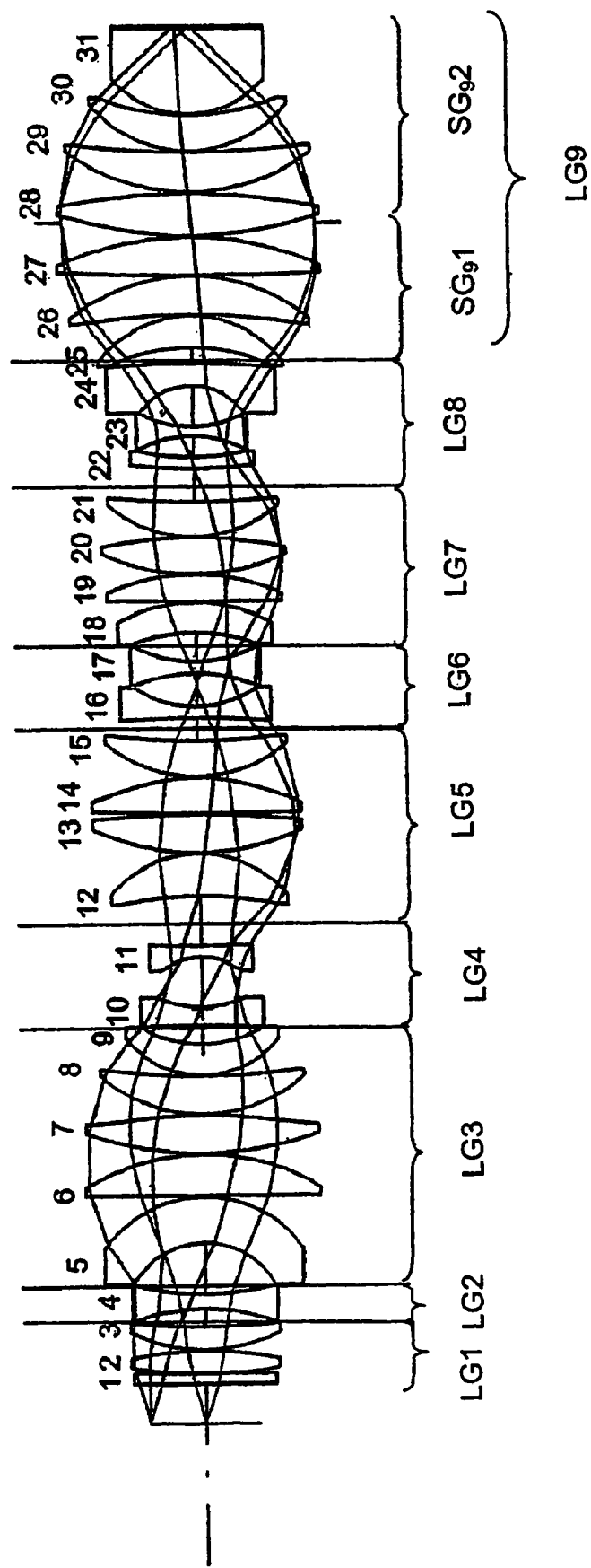
FIG. 1 is a schematic illustration of a first exemplary embodiment of a projection optical system according to the present invention.

In the exemplary embodiments described below, components that are alike in function and structure are designated as far as possible by alike reference numerals. Therefore, to understand the features of the individual components of a specific embodiment, the descriptions of other embodiments and of the summary of the invention should be referred to.

In FIG. 1, an optical path diagram of a first exemplary embodiment of a projection optical system according to the present invention is depicted. As indicated by the brackets, a first group of lenses LG1 includes four lenses 1, 2, 3 and has positive refractive power; a second group of lenses LG2 is formed of (single) lens 4 and has negative optical power; the third group of lenses LG3 includes five lenses 5, 6, 7, 8, 9 and has positive refractive power; the fourth group of lenses LG4 includes two lenses 10, 11 and has negative refractive power; the fifth group of lenses LG5 includes four lenses 12, 13, 14, 15 and has positive refractive power; the sixth group of lenses LG6 includes two lenses 16, 17 and has negative refractive power; the seventh group of lenses LG7 includes four lenses 18, 19, 20, 21 and has positive refractive power; the eighth group of lenses LG8 includes three lenses 22, 23, 24 and has negative refractive power; and a first subgroup $SG_91$ of the ninth group of lenses LG9 includes three lenses 25, 26, 27 and has positive refractive power, a second subgroup $SG_92$ of the ninth group of lenses LG9 includes four lenses 28, 29, 30, 31 and has also positive refractive power.

In particular, in a direction from the first object to the second object, the first group of lenses LG1 includes a plane parallel plate 1, a biconvex lens 2, a convex meniscus lens 3; lens 4 of LG2 is a biconcave lens; the third group of lenses LG3 includes a meniscus lens 5, a nearly planar convex lens 6, a biconvex lens 7 and two meniscus lenses 8, 9; the fourth group of lenses LG4 includes two biconcave lenses 10, 11, wherein both of those biconcave lenses have one surface which has a greater curvature than a respective second surface and wherein those surfaces of the biconcave lenses which have the greater curvature face each other; the fifth group of lenses LG5 is a fairly symmetrical arrangement of two convex meniscus lenses 12, 15 and two biconvex lenses 13, 14 in between the two meniscus lenses 12, 15; the sixth group of lenses LG6 includes two biconcave lenses 16,17; the seventh group of lenses LG7 includes two meniscus lenses 18, 21 and two biconvex lenses 19, 20 in between the two meniscus lenses 18, 21; the eighth group of lenses LG8 includes a meniscus lens 22, a biconcave lens 23 and a concave meniscus lens 24; and the ninth group of lenses LG9 comprises two convex meniscus 25, 26 lenses, two biconvex lenses 27, 28 and two convex meniscus lenses 29, 30 as well as a lens 31 with a convex surface facing in the direction of the first object and a planar surface in a direction of the second object.

Overall, the projection optical system includes 31 lenses. The ninth group of lenses LG9 also includes an aperture stop in between the first and the second subgroups.

A center of an intermediate image is formed within the sixth group of lenses LG6, and is located in particular in between the first lens 16 and the second lens 17 of lens group LG6. Rays emanating from a point on the optical axis under different angles cross there in one point. It can also be seen in FIG. 1 that rays emanating from points located at a distance from he optical axis do not cross in a single point, due to coma. Therefore, the intermediate image formed is not a perfect "sharp" image.

In this exemplary embodiment of the present invention, an angle of at least one chief ray of the intermediate image is about 8.6°, a longitudinal spherical aberration of the intermediate image is about 13 mm, an astigmatism value of the intermediate image is about 30 mm, an aberration of the intermediate image is about 9%, a RMS of a spot diameter on the optical axis of the projection optical system is about 1 mm, a RMS of a spot diameter at a field point farthest away from the optical axis of the projection optical system is about 16 mm.

Detailed information on parameters of the lenses, such as thickness of the lens, lens material, radius of curvature of the optical surface and one half of the effective diameter of the lens are listed in Table 1 (radius, thickness and diameter are given in units of mm; the refractive index is given for a wavelength of 193 nm). In addition, an indication of a position of aspherical surfaces in the projection optical system and their parameters are given in Table 1.

TABLE 1

| Lens# | Surface | Radius | | Thickness | Lens material | Refractive Index | ½ Diameter |
|---|---|---|---|---|---|---|---|
|  | 0 | ∞ |  | 40.000000000 |  | 1.00000000 | 53.000 |
| 1 | 1 | ∞ |  | 10.000000000 | SILUV | 1.56049116 | 64.526 |
|  | 2 | ∞ |  | 1.000000000 |  | 1.00000000 | 66.329 |
| 2 | 3 | 1188.659667350 | AS | 21.468222523 | SILUV | 1.56049116 | 67.830 |
|  | 4 | −325.055504302 |  | 1.000000000 |  | 1.00000000 | 68.736 |
| 3 | 5 | 155.617006797 |  | 22.934934551 | SILUV | 1.56049116 | 69.283 |
|  | 6 | 727.536884813 |  | 18.174889229 |  | 1.00000000 | 67.710 |
| 4 | 7 | −192.646034091 |  | 14.999828607 | SILUV | 1.56049116 | 67.126 |
|  | 8 | 273.881364877 | AS | 50.665512844 |  | 1.00000000 | 67.600 |
| 5 | 9 | −77.020751690 |  | 45.516341012 | SILUV | 1.56049116 | 67.888 |
|  | 10 | −114.604649117 |  | 1.000000000 |  | 1.00000000 | 92.155 |
| 6 | 11 | −109987.496020000 |  | 40.293744935 | SILUV | 1.56049116 | 107.213 |
|  | 12 | −208.761364284 |  | 1.000000000 |  | 1.00000000 | 109.107 |
| 7 | 13 | 312.047113737 |  | 37.896771546 | SILUV | 1.56049116 | 107.966 |
|  | 14 | −391.379716197 | AS | 1.000000000 |  | 1.00000000 | 106.562 |
| 8 | 15 | 140.792401571 |  | 38.279905762 | SILUV | 1.56049116 | 94.431 |
|  | 16 | 595.044328920 |  | 1.000000000 |  | 1.00000000 | 90.332 |
| 9 | 17 | 89.636711846 |  | 32.204876945 | SILUV | 1.56049116 | 70.645 |
|  | 18 | 111.608346837 |  | 19.054222657 |  | 1.00000000 | 58.330 |
| 10 | 19 | −429.397084300 | AS | 18.209656873 | SILUV | 1.56049116 | 57.080 |
|  | 20 | 98.226077778 |  | 50.232325179 |  | 1.00000000 | 41.561 |
| 11 | 21 | −61.703307112 |  | 11.999904429 | SILUV | 1.56049116 | 37.972 |
|  | 22 | 1661.483397630 |  | 49.691525854 |  | 1.00000000 | 47.513 |
| 12 | 23 | −344.829665657 |  | 42.085244023 | SILUV | 1.56049116 | 75.077 |
|  | 24 | −107.671909899 |  | 1.000000000 |  | 1.000000000 | 81.492 |
| 13 | 25 | 227.651221386 |  | 37.735333942 | SILUV | 1.56049116 | 96.198 |
|  | 26 | −971.294005629 |  | 1.000000000 |  | 1.00000000 | 96.695 |
| 14 | 27 | 2411.309898770 |  | 35.231061101 | SILUV | 1.56049116 | 96.779 |
|  | 28 | −172.470493948 | AS | 1.000000000 |  | 1.00000000 | 96.697 |
| 15 | 29 | 127.199282894 |  | 35.979585035 | SILUV | 1.56049116 | 83.764 |
|  | 30 | 590.640003478 |  | 22.420160606 |  | 1.00000000 | 79.423 |
| 16 | 31 | −1136.135888880 |  | 11.999850457 | SILUV | 1.56049116 | 69.651 |
|  | 32 | 97.965840133 |  | 33.048150980 |  | 1.00000000 | 58.175 |
| 17 | 33 | −150.955637569 |  | 11.999737315 | SILUV | 1.56049116 | 57.812 |
|  | 34 | 119.446001017 | AS | 28.704766869 |  | 1.00000000 | 59.976 |
| 18 | 35 | −169.101684614 |  | 30.810844072 | SILUV | 1.56049116 | 60.862 |
|  | 36 | −143.556940908 |  | 1.000000000 |  | 1.00000000 | 71.166 |
| 19 | 37 | 6059.614308150 |  | 27.240629998 | SILUV | 1.56049116 | 78.835 |
|  | 38 | −198.152203067 |  | 1.000000000 |  | 1.00000000 | 80.968 |
| 20 | 39 | 237.266870348 | AS | 35.744593296 | SILUV | 1.56049116 | 84.978 |
|  | 40 | −432.817798201 |  | 1.000000000 |  | 1.00000000 | 83.945 |
| 21 | 41 | 118.462571930 |  | 35.488600864 | SILUV | 1.56049116 | 78.566 |
|  | 42 | 685.595455023 |  | 33.017147840 |  | 1.00000000 | 74.975 |
| 22 | 43 | 428.917580057 |  | 12.000000000 | SILUV | 1.56049116 | 57.406 |
|  | 44 | 227.044290939 |  | 20.509997540 |  | 1.00000000 | 52.054 |

TABLE 1-continued

| | | | | | | |
|---|---|---|---|---|---|---|
| 23 | 45 | −102.067563936 AS | 10.000000000 | SILUV | 1.56049116 | 51.298 |
| | 46 | 101.557348748 | 41.525133257 | | 1.00000000 | 49.401 |
| 24 | 47 | −59.061918360 | 22.768528549 | SILUV | 1.56049116 | 49.766 |
| | 48 | −1043.526546090 AS | 16.290454399 | | 1.00000000 | 78.032 |
| 25 | 49 | −178.935907735 | 32.555772497 | SILUV | 1.56049116 | 79.473 |
| | 50 | −106.364609023 | 1.000000000 | | 1.00000000 | 85.792 |
| 26 | 51 | −632.435188067 | 39.079252875 | SILUV | 1.56049116 | 107.073 |
| | 52 | −174.987008053 | 1.000000000 | | 1.00000000 | 110.790 |
| 27 | 53 | 2805.478184950 | 38.636643743 | SILUV | 1.56049116 | 121.294 |
| | 54 | −294.402220845 | 14.000000000 | | 1.00000000 | 122.565 |
| | 55 | ∞ | −13.000000000 | | 1.00000000 | 120.985 |
| 28 | 56 | 341.515594164 AS | 41.973867680 | SILUV | 1.56049116 | 121.957 |
| | 57 | −613.012676946 | 1.000000000 | | 1.00000000 | 121.709 |
| 29 | 58 | 186.221573607 | 40.343551809 | SILUV | 1.56049116 | 113.484 |
| | 59 | 854.107417415 | 0.999662417 | | 1.00000000 | 110.285 |
| 30 | 60 | 118.210352635 | 35.190252216 | SILUV | 1.56049116 | 91.465 |
| | 61 | 221.690971967 | 1.000000000 | | 1.00000000 | 85.108 |
| 31 | 62 | 93.839361326 | 85.998752419 | SILUV | 1.56049116 | 70.310 |
| | 63 | ∞ | 1.999818350 | Water | 1.43680000 | 15.666 |
| | 64 | ∞ | 0.000181480 | | 1.00000000 | 13.250 |

Aspherical Surfaces

Surface 3

K: 0.0000
C1: 5.70001135e−008
C2: 9.7673749ge−012
C3: 8.19029831e−017
C4: 8.84893220e−020
C5: −1.76156850e−023
C6: 1.45768927e−0274
C7: 0.00000000e+000
C8: 0.00000000e+000
C9: 0.00000000e+000

Surface 8

K: 0.0000
C1: −2.34985768e−008
C2: 5.68067165e−012
C3: −1.05424515e−015
C4: 2.80117106e−019
C5: −4.74649134e−023
C6: 3.78500346e−027
C7: 0.00000000e+000
C8: 0.00000000e+000
C9: 0.00000000e+000

Surface 14

K: 0.0000
C1: 4.54530065e−008
C2: −2.99107441e−013
C3: 2.61057788e−017
C4: −2.36906603e−023
C5: 2.40679240e−026
C6: −9.4351673ge−031
C7: 0.00000000e+000
C8: 0.00000000e+000
C9: 0.00000000e+000

Surface 19

K: 0.0000
C1: 2.63529568e−007
C2: −1.38048336e−011
C3: 9.47230160e−016
C4: −1.39516446e−019
C5: 3.34855694e−023
C6: −2.5433053ge−027
C7: 0.00000000e+000
C8: 0.00000000e+000
C9: 0.00000000e+000

Surface 28

K: 0.0000
C1: 8.72339285e−008
C2: −5.87555973e−013
C3: 3.69484334e−017
C4: −8.29838683e−022
C5: 2.8II5454e−026
C6: 1.10167667e−031
C7: 0.00000000e+000
C8: 0.00000000e+000
C9: 0.00000000e+000

Surface 34

K: 0.0000
C1: −3.077I5536e−008
C2: 2.82667732e−012
C3: −3.58560604e−015
C4: 4.34984764e−019
C5: −7.279I4300e−024
C6: −1.84976566e−027
C7: 0.00000000e+000
C8: 0.00000000e+000
C9: 0.00000000e+000

Surface 39

K: 0.0000
C1: 5.07I96594e−008
C2: 1.34564781−012
C3: −7.71337598e−017
C4: −4.89233493e−021
C5: 2.48728554e−025
C6: −1.07698735e−030
C7: 0.00000000e+000
C8: 0.00000000e+000
C9: 0.00000000e+000

Surface 45

K: 0.0000
C1: 2.I7356870e−007
C2: −3.86297236e−011
C3: 4.28396866e−015
C4: 3.30679772e−019
C5: −1.4595826ge−022
C6: −4.8394607ge−027
C7: 0.00000000e+000
C8: 0.00000000e+000
C9: 0.00000000e+000

Surface 48

K: 0.0000
C1: 4.82747886e−009
C2: −7.95248576e−012
C3: 9.I45I327Ie−016
C4: −4.70224273e−020
C5: −3.I9828820e−025
C6: 6.66424710e−029
C7: 0.00000000e+000
C8: 0.00000000e+000
C9: 0.00000000e+000

Surface 56

K: 0:0000
C1: −8.46890011e−009
C2: −8.6627038ge−014
C3: −2.06359620e−018
C4: 7.65545904e−023
C5: −3.32533536e−028
C6: −2.692I0340e−032
C7: 0.00000000e+000
C8: 0.00000000e+000
C9: 0.00000000e+000

An aspherical surface can be characterised by the following equation:

$$p(h) = \frac{\frac{h^2}{r}}{1 + \sqrt{1 - (1+K)\frac{h^2}{r^2}}} + C_1 \cdot h^4 + C_2 \cdot h^6 + \ldots$$

wherein
r is radius of curvature in the apex of the aspherical surface (paraxial curvature),
h is a distance of a point on the aspherical surface from the optical axis (or height of the aspherical surface from the optical axis),
p(h) is the sag of the surface in axial direction, i.e. a distance along the direction of the optical axis from a tangent plane to a vertex of the aspheric surface,
K is a conical coefficient and
$C_1 \ldots C_6$ are aspherical coefficients.

The lens material SILUV indicated in the Tables designates a quartz glass adapted for applications using ultraviolet light. The lens material CAFUV indicated in the Tables designates a calcium fluoride material adapted for applications using ultraviolet light.

As evident from Table 1, the exemplary embodiment of an immersion type projection optical system contains 10 aspherical surfaces.

The numerical aperture (NA) at the first object is 0.275, the numerical aperture (NA) at the intermediate image is 0.267, and the numerical aperture (NA) at the second object is 1.1. An imaging magnification $\beta_1$ from the first object to the intermediate image is −1.032, an imaging magnification $\beta_2$ from the intermediate image to the second object is −0.242, such that a total magnification $\beta_1 \cdot \beta_2$ from the first object to the second object is 0.25.

Figure 2:
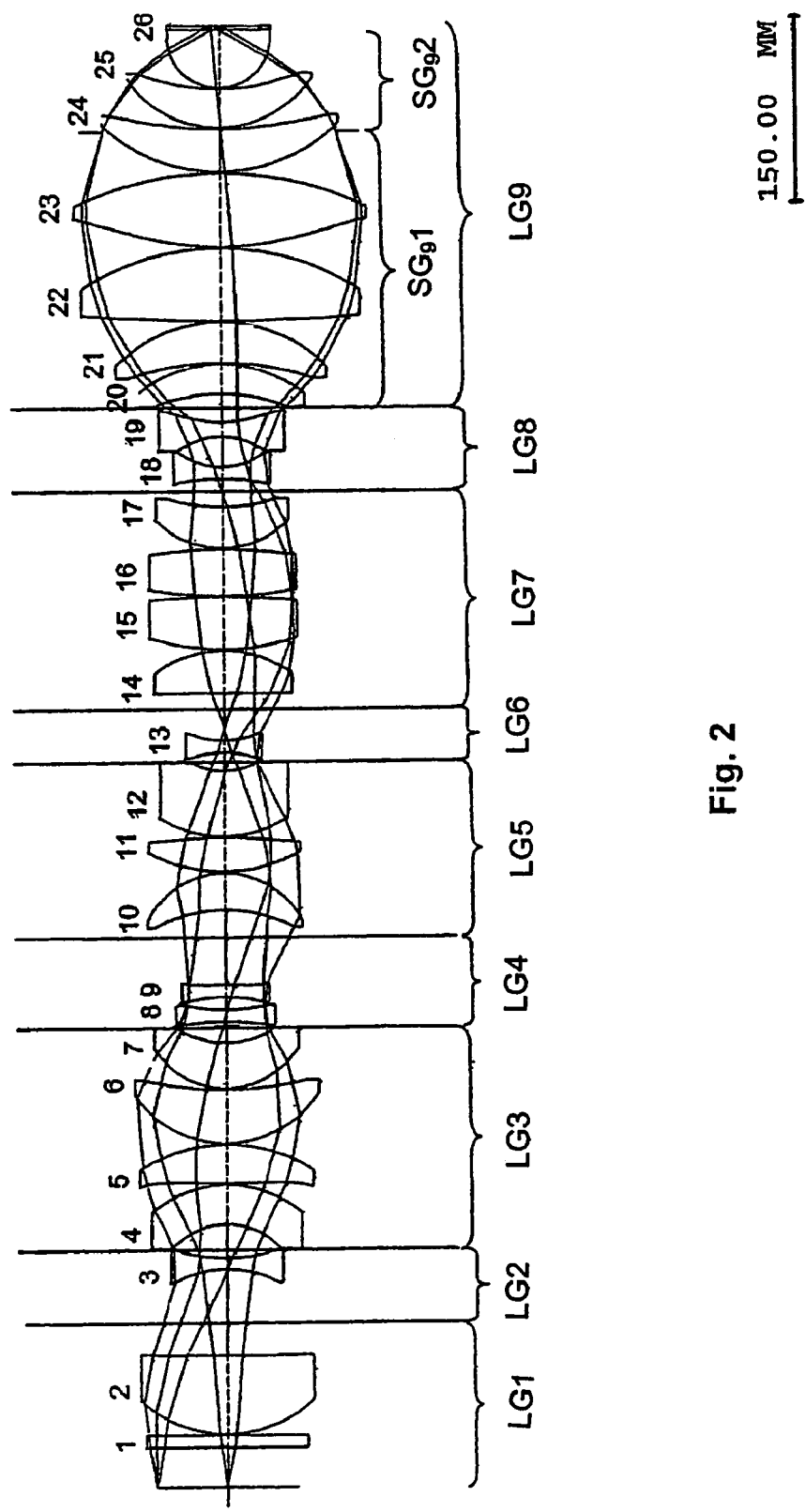
FIG. 2 is a schematic illustration of a second exemplary embodiment of a projection optical system according to the present invention.

FIG. 2 schematically illustrates a second exemplary embodiment of the projection optical system according to the present invention. This embodiment has a numerical aperture of about 1.3. The brackets indicate which lens or which lenses are attributed to which group of lenses. The first group of lenses LG1 includes two lenses 1, 2 and has positive refractive power, the second group of lenses LG2 includes only one lens 3 and has negative refractive power, the third group of lenses LG3 includes four lenses 4, 5, 6, 7 and has positive refractive power, the fourth group of lenses LG4 includes two lenses 8, 9 and has negative refractive power, the fifth group of lenses LG5 includes three lenses 10, 11, 12 and has positive refractive power, the sixth group of lenses LG6 includes only one lens 13 and has negative refractive power, the seventh group of lenses LG7 includes four lenses 4, 15, 16, 17 and has positive refractive power, the eighth group of lenses LG8 includes two lenses 18, 19 and has negative refractive power and the ninth group of lenses LG9 includes seven lenses 20, 21, 22, 23, 24, 25, 25 and has positive refractive power. The ninth group of lenses LG9 may be subdivided into two subgroups, the first subgroup $SG_91$ comprising the lenses of the ninth group that are disposed in between the first object and the aperture stop (lenses 20 to 23) and the second subgroup $SG_92$ comprising the lenses of the ninth group LG9 that are disposed in between the aperture stop and the second object (lenses 24 to 26).

In particular, in a direction from the first object to the second object, the first group of lenses LG1 includes a plane parallel plate 1 and a substantially plano-convex lens 2; the second group of lenses LG2 includes a biconcave lens 3, the second group of lenses LG2 being separated from the first group of lenses LG1 by a relatively large air gap; the third group of lenses LG3 includes a meniscus lens 4, a convex lens 5 and two meniscus lenses 6, 7, the fourth group of lenses LG4 includes two biconcave lenses 8, 9; the fifth group of lenses LG5 includes a meniscus lens 10, a biconvex lens 11, and a meniscus lens 12; the sixth group of lenses LG5 includes one biconcave lens 13; the seventh group of lenses includes a plano-convex lens 14, two biconvex lenses 15, 16 and a meniscus lens 17; the eight group of lenses LG8 includes two biconcave lenses 18, 19, and the ninth group of lenses LG9 includes two meniscus lenses 20, 21, two biconvex lenses 22, 23, two meniscus lenses 24, 25 and a plano-convex lens 26. This projection optical system is further characterized in that the lenses in the first, third, fifth and seventh groups of lenses each have relatively small diameters.

In the second exemplary embodiment, the intermediate image is formed in the sixth group of lenses LG6. In this exemplary embodiment of the present invention, an angle of at least one chief ray of the intermediate image is about 28.5°, a longitudinal spherical aberration of the intermediate image is about 0.94 mm, an astigmatism value of the intermediate image is about 11.8 mm, an aberration of the intermediate image is about −2.1%, a RMS of a spot diameter on an optical axis of the projection optical system is about 0.6 mm, a RMS of a spot diameter at a field point farthest away from the optical axis of the projection optical system is about 5.1 mm.

Detailed information on lens parameters such as thickness of the lens, lens material, radius of the optical surface and the value of one half of the effective diameter of the lens for the second exemplary embodiment are listed in Table 2 (radius, thickness and diameter are given in units of mm; the refractive index is given for a wavelength of 193 nm). In addition, an indication of a position of aspherical surfaces in the projection optical system and their parameters are given in Table 2.

TABLE 2

| Lens # | Surface | Radius | Thickness | Lens material | Refractive Index | ½ Diameter |
|---|---|---|---|---|---|---|
| 0 | 0 | ∞ | 32.000000000 | | 1.00000000 | 56.000 |
| 1 | 1 | ∞ | 10.000000000 | SILUV | 1.56049116 | 61.280 |
| | 2 | ∞ | 1.000000000 | | 1.00000000 | 63.329 |
| 2 | 3 | 100.733544514 | 62.667723686 | SILUV | 1.56049116 | 66.653 |
| | 4 | 32022.952347600 AS | 70134547178 | | 1.00000000 | 58.743 |
| 3 | 5 | −84.779999894 | 9.000000000 | SILUV | 1.56049116 | 41.640 |
| | 6 | 124.100395299 AS | 27.042753966 | | 1.00000000 | 42.594 |

TABLE 2-continued

| | | | | | | | |
|---|---|---|---|---|---|---|---|
| 4 | 7 | −58.387067887 | | 32.224091935 | SILUV | 1.56049116 | 42.973 |
| | 8 | −89.495828338 | | 1.000000000 | | 1.00000000 | 57.226 |
| 5 | 9 | 637.424312309 | AS | 31.249717824 | SILUV | 1.56049116 | 63.302 |
| | 10 | −125.457411370 | | 1.000000000 | | 1.00000000 | 66.789 |
| 6 | 11 | 87.142282901 | | 43.194516336 | SILUV | 1.56049116 | 71.140 |
| | 12 | 277.245672397 | | 1.000000000 | | 1.00000000 | 65.566 |
| 7 | 13 | 65.650106643 | | 37.378396547 | SILUV | 1.56049116 | 54.716 |
| | 14 | 70.641087666 | | 17.179300000 | | 1.00000000 | 39.429 |
| 8 | 15 | −222.806366019 | | 10.000000000 | SILUV | 1.56049116 | 37.867 |
| | 16 | 148.946283435 | | 10.386040060 | | 1.00000000 | 32.053 |
| 9 | 17 | −110.856025103 | | 10.000000000 | SILUV | 1.56049116 | 31.056 |
| | 18 | −441.185155014 | AS | 60.806885163 | | 1.00000000 | 33.310 |
| 10 | 19 | −115.871220561 | | 29.971002452 | SILUV | 1.56049116 | 54.778 |
| | 20 | −67.675896231 | | 1.000000000 | | 1.00000000 | 59.166 |
| 11 | 21 | 122.823548172 | | 27.522471538 | SILUV | 1.56049116 | 57.550 |
| | 22 | −309.184286918 | AS | 0.600000000 | | 1.00000000 | 55.548 |
| 12 | 23 | 90.971070084 | | 53.606853082 | SILUV | 1.56049116 | 48.656 |
| | 24 | 53.484081747 | | 14.538911633 | | 1.00000000 | 26.876 |
| 13 | 25 | −79.033769110 | | 10.000000000 | SILUV | 1.56049116 | 26.339 |
| | 26 | 72.653436508 | AS | 38.345474204 | | 1.00000000 | 28.975 |
| 14 | 27 | −2900.861854210 | | 34.681904182 | SILUV | 1.56049116 | 46.375 |
| | 28 | −89.912398367 | | 1.000000000 | | 1.00000000 | 52.359 |
| 15 | 29 | 185.647971655 | | 43.084526832 | SILUV | 1.56049116 | 55.946 |
| | 30 | −575.357419176 | | 1.000000000 | | 1.00000000 | 55.177 |
| 16 | 31 | 564.297938029 | AS | 37.364414663 | SILUV | 1.56049116 | 55.662 |
| | 32 | −353.745030574 | | 1.000000000 | | 1.00000000 | 54.497 |
| 17 | 33 | 72.220793243 | | 33.554938963 | SILUV | 1.56049116 | 50.519 |
| | 34 | 135.919156304 | | 22.801797274 | | 1.00000000 | 42.367 |
| 18 | 35 | −559.501580107 | AS | 10.000000000 | SILUV | 1.56049116 | 36.79619 |
| | 36 | 55.246497668 | | 24.571144054 | | 1.00000000 | 33.677 |
| 19 | 37 | −57.654090614 | | 12.000001146 | SILUV | 1.56049116 | 34.184 |
| | 38 | 81.435897123 | AS | 23.389527676 | | 1.00000000 | 47.984 |
| 20 | 39 | −138.774239558 | | 24.397599913 | SILUV | 1.56049116 | 52.581 |
| | 40 | −101.724186955 | | 1.000000000 | | 1.00000000 | 63.478 |
| 21 | 41 | −219.325940773 | | 33.639467701 | SILUV | 1.56049116 | 73.220 |
| | 42 | −115.213916303 | | 0.999998360 | | 1.00000000 | 81.562 |
| 22 | 43 | 1392.045998250 | | 58.673748551 | SILUV | 1.56049116 | 101.704 |
| | 44 | −203.620511778 | | 1.000000000 | | 1.00000000 | 108.306 |
| 23 | 45 | 231.429869259 | AS | 58.933085574 | SILUV | 1.56049116 | 113.649 |
| | 46 | −272.100613336 | | 33.533113389 | | 1.00000000 | 113.307 |
| | 47 | ∞ | | −32.533113389 | | 1.00000000 | 93.345 |
| 24 | 48 | 134.670223347 | | 34.693999198 | SILUV | 1.56049116 | 92.605 |
| | 49 | 336.731245700 | AS | 1.000000000 | | 1.00000000 | 88.261 |
| 25 | 50 | 87.745787808 | | 31.038932143 | SILUV | 1.56049116 | 71.327 |
| | 51 | 157.022439156 | AS | 1.000000000 | | 1.00000000 | 64.932 |
| 26 | 52 | 41.017420667 | | 47.655583536 | CAFUV | 1.50110592 | 40.098 |
| | 53 | ∞ | | 3.000000000 | $H_2O$ | 1.43680000 | 13.439 |
| | 54 | ∞ | | 0.000000000 | | 1.00000000 | 7.000 |

Aspherical Surfaces

| Surface 4 | Surface 6 | Surface 9 |
|---|---|---|
| K: 0.0000 | K: 0.0000 | K: 0.0000 |
| C1: 6.91762547e−008 | C1: −4.27433833e−007 | C1: −2.70725252e−007 |
| C2: −1.00821998e−012 | C2: 9.24619398e−011 | C2: 7.89014814e−012 |
| C3: 8.22439961e−016 | C3: −6.99952985e−014 | C3: −1.45142628e−015 |
| C4: −1.26146197e−019 | C4: 3.04240551e−017 | C4: −2.26439260e−019 |
| C5: −5.92492144e−024 | C5: −8.56628971e−021 | C5: 7.10185165e−023 |
| C6: 1.68627707e−027 | C6: 6.04286715e−025 | C6: −1.37233277e−026 |
| C7: 0.00000000e+000 | C7: 0.00000000e+000 | C7: 0.00000000e+000 |
| C8: 0.00000000e+000 | C8: 0.00000000e+000 | C8: 0.00000000e+000 |
| C9: 0.00000000e+000 | C9: 0.00000000e+000 | C9: 0.00000000e+000 |

| Surface 18 | Surface 22 | Surface 26 |
|---|---|---|
| K: 0.0000 | K: 0.0000 | K: 0.0000 |
| C1: 1.13326160e−006 | C1: 1.86984594e−007 | C1: −1.22627425e−007 |
| C2: 4.69642710e−010 | C2: −7.47098219e−012 | C2: −1.73570760e−011 |
| C3: 1.93983951e−013 | C3: 7.81949424e−016 | C3: 1.56978236e−014 |
| C4: 3.77234480e−017 | C4: −1.23355413e−019 | C4: −1.27740748e−016 |
| C5: 1.20657590e−020 | C5: 1.39727008e−023 | C5: 9.41034563e−020 |
| C6: 1.10191897e−023 | C6: 1.72439306e−028 | C6: −2.50468463e−023 |
| C7: 0.00000000e+000 | C7: 0.00000000e+000 | C7: 0.00000000e+000 |
| C8: 0.00000000e+000 | C8: 0.00000000e+000 | C8: 0.00000000e+000 |
| C9: 0.00000000e+000 | C9: 0.00000000e+000 | C9: 0.00000000e+000 |

| Surface 31 | Surface 35 | Surface 38 |
|---|---|---|
| K: 0.0000 | K: 0.0000 | K: 0.0000 |
| C1: 1.43703293e−007 | C1: −1.42590228e−006 | C1: −1.21758383e−006 |

TABLE 2-continued

| | | |
|---|---|---|
| C2: 1.13355487e−011 | C2: −1.97387056e−010 | C2: 2.25752422e−011 |
| C3: −6.75460046e−016 | C3: 4.78455973e−014 | C3: 1.11782472e−014 |
| C4: −7.03138870e−020 | C4: 1.62503154e−017 | C4: −5.16089164e−018 |
| C5: −1.74001972e−023 | C5: 2.50774387e−020 | C5: 5.93762703e−022 |
| C6: 1.93426816e−027 | C6: −1.12531033e−027 | C6: −5.20615255e−026 |
| C7: 0.00000000e+000 | C7: 0.00000000e+000 | C7: 0.00000000e+000 |
| C8: 0.00000000e+000 | C8: 0.00000000e+000 | C8: 0.00000000e+000 |
| C9: 0.00000000e+000 | C9: 0.00000000e+000 | C9: 0.00000000e+000 |
| Surface 45 | Surface 49 | Surface 51 |
| K: 0:0000 | K: 0:0000 | K: 0:0000 |
| C1: −3.74737153e−008 | C1: −5.35416508e−009 | C1: −6.44904425e−008 |
| C2: −7.62435274e−013 | C2: 5.84206555e−013 | C2: −7.20142509e−012 |
| C3: −6.93980539e−018 | C3: −1.02043747e−016 | C3: 6.07409160e−016 |
| C4: −4.33525846e−022 | C4: −2.70496897e−020 | C4: 9.20273534e−019 |
| C5: 8.52520503e−026 | C5: 1.68712776e−024 | C5: −1.85277777e−022 |
| C6: −2.83405796e−030 | C6: −3.20799816e−030 | C6: 1.48428230e−026 |
| C7: 0.00000000e+000 | C7: 0.00000000e+000 | C7: 0.00000000e+000 |
| C8: 0.00000000e+000 | C8: 0.00000000e+000 | C8: 0.00000000e+000 |
| C9: 0.00000000e+000 | C9: 0.00000000e+000 | C9: 0.00000000e+000 |

A numerical aperture (NA) at the first object is 0.1625, the numerical aperture (NA) at the intermediate image is 0.285, and the numerical aperture (NA) at the second object is 1.3. An imaging magnification $\beta_1$ from the first object to the intermediate image is −0.57, an imaging magnification $\beta_2$ from the intermediate image to the second object is −0.219, such that a total magnification $\beta_1 \cdot \beta_2$ from the first object to the second object is 0.125.

Figure 3:
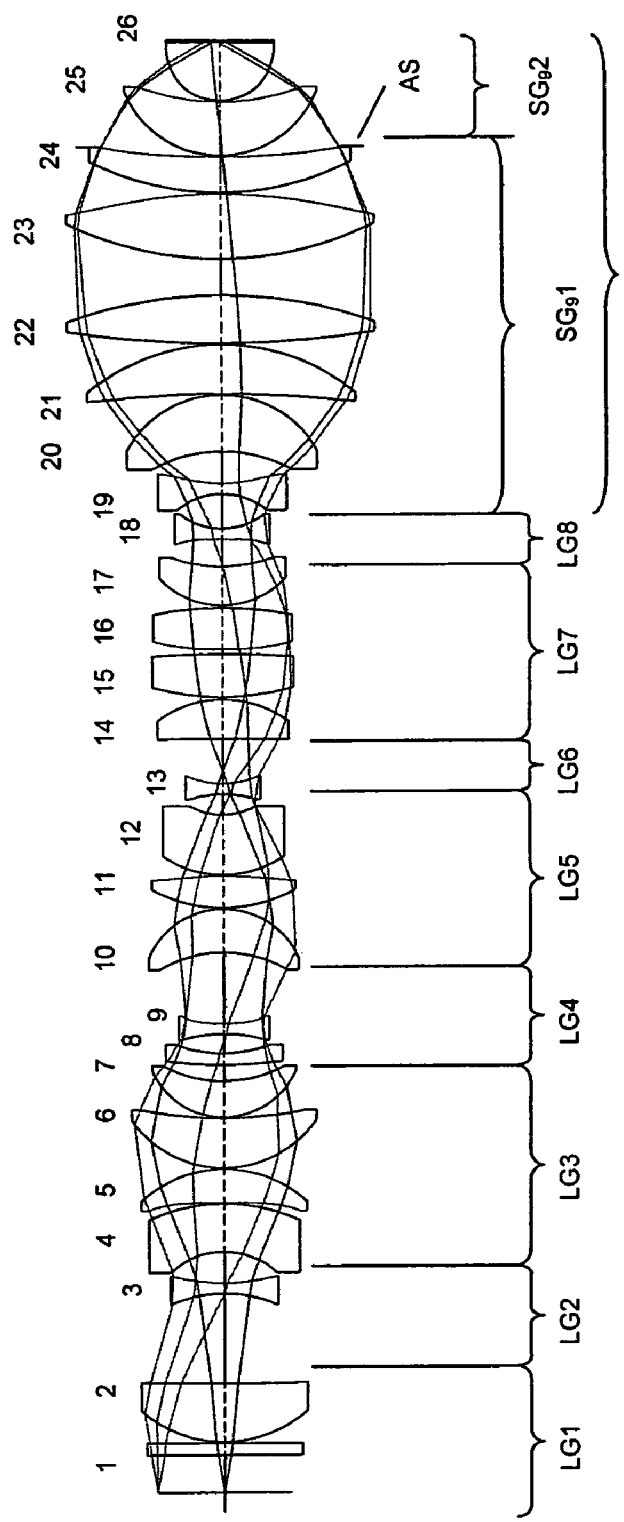
FIG. 3 is a schematic illustration of a third exemplary embodiment of a projection optical system according to the present invention.

FIG. 3 schematically illustrates a third exemplary embodiment of the projection optical system according to the present invention. The projection optical system shown in FIG. 3 has a similar structure as that shown in FIG. 2.

Optical data of the projection optical system of FIG. 3 are given in Table 3 below.

TABLE 3

| Lens # | Surface | Radius | Thickness | Lens material | Refractive Index | ½ Diameter |
|---|---|---|---|---|---|---|
| | 0 | ∞ | 32.000000000 | | 1.00000000 | 56.000 |
| 1 | 1 | ∞ | 9.994926454 | SILUV | 1.56049116 | 61.487 |
| | 2 | ∞ | 0.983970249 | | 1.00000000 | 62.576 |
| 2 | 3 | 104.335302767 | 50.000128595 | SILUV | 1.56049116 | 66.908 |
| | 4 | −3106.949722908 AS | 76.175374387 | | 1.00000000 | 62.019 |
| 3 | 5 | −108.162859030 | 8.996945596 | SILUV | 1.56049116 | 43.312 |
| | 6 | 145.872762253 AS | 26.612977949 | | 1.00000000 | 43.188 |
| 4 | 7 | −63.692112581 | 41.121449191 | SILUV | 1.56049116 | 43.598 |
| | 8 | −148.694829892 | 0.999314823 | | 1.00000000 | 60.533 |
| 5 | 9 | −1881.227188585 AS | 28.600200276 | SILUV | 1.56049116 | 62.871 |
| | 10 | −100.640093152 | 0.998292928 | | 1.00000000 | 66.648 |
| 6 | 11 | 93.310678254 | 42.633131227 | SILUV | 1.56049116 | 74.614 |
| | 12 | 330.638332368 | 0.996803092 | | 1.00000000 | 70.108 |
| 7 | 13 | 65.552800218 | 30.873146207 | SILUV | 1.56049116 | 57.917 |
| | 14 | 105.866610652 | 13.963247135 | | 1.00000000 | 50.783 |
| 8 | 15 | 367.134055921 | 9.793129426 | SILUV | 1.56049116 | 46.925 |
| | 16 | 107.242761257 | 16.571541756 | | 1.00000000 | 38.861 |
| 9 | 17 | −125.867739347 | 8.997719804 | SILUV | 1.56049116 | 36.093 |
| | 18 | 176.780711857 AS | 61.484433369 | | 1.00000000 | 33.520 |
| 10 | 19 | −102.551788067 | 37.043696332 | SILUV | 1.56049116 | 52.676 |
| | 20 | −67.900979720 | 0.997513775 | | 1.00000000 | 60.304 |
| 11 | 21 | 122.872438500 | 27.058733851 | SILUV | 1.56049116 | 58.037 |
| | 22 | −318.215075265 AS | 0.998963808 | | 1.00000000 | 56.115 |
| 12 | 23 | 88.799497079 | 51.427075983 | SILUV | 1.56049116 | 48.524 |
| | 24 | 53.527140946 | 17.646941838 | | 1.00000000 | 26.980 |
| 13 | 25 | −80.288767257 | 8.996807285 | SILUV | 1.56049116 | 26.963 |
| | 26 | 73.896625355 AS | 37.739389033 | | 1.00000000 | 29.546 |
| 14 | 27 | −2111.719991198 | 33.548344902 | SILUV | 1.56049116 | 46.806 |
| | 28 | −90.879698694 | 2.062998346 | | 1.00000000 | 52.624 |
| 15 | 29 | 207.677300574 | 36.682295744 | SILUV | 1.56049116 | 56.675 |
| | 30 | −950.438335639 | 4.239364713 | | 1.00000000 | 56.460 |
| 16 | 31 | 412.576525922 AS | 35.094990292 | SILUV | 1.56049116 | 55.932 |
| | 32 | −288.898999836 | 2.054606078 | | 1.00000000 | 54.344 |
| 17 | 33 | 72.294412199 | 33.413205228 | SILUV | 1.56049116 | 50.689 |
| | 34 | 126.924823744 | 23.263607131 | | 1.00000000 | 42.670 |
| 18 | 35 | −610.144871693 AS | 9.004431664 | SILUV | 1.56049116 | 37.723 |
| | 36 | 56.861698660 | 29.493986876 | | 1.00000000 | 35.203 |
| 19 | 37 | −56.969571039 | 8.997309770 | SILUV | 1.56049116 | 36.575 |
| | 38 | 99.784593360 AS | 27.465223390 | | 1.00000000 | 51.821 |

TABLE 3-continued

| | | | | | | |
|---|---|---|---|---|---|---|
| 20 | 39 | −117.765690318 | 48.249958252 | SILUV | 1.56049116 | 57.605 |
| | 40 | −90.269492866 | 0.773643744 | | 1.00000000 | 77.087 |
| 21 | 41 | −875.910732301 | 42.249248610 | SILUV | 1.56049116 | 104.385 |
| | 42 | −172.604598891 | 0.974038994 | | 1.00000000 | 108.929 |
| 22 | 43 | 803.097825670 | 41.021577890 | SILUV | 1.56049116 | 123.629 |
| | 44 | −376.629540438 | 30.903940303 | | 1.00000000 | 124.899 |
| 23 | 45 | 287.536526769 | 55.352280753 | SILUV | 1.56049116 | 125.000 |
| | 46 | −397.989329067 AS | 40.345224742 | | 1.00000000 | 123.309 |
| | 47 | ∞ | −39.345382978 | | 1.00000000 | 100.204 |
| 24 | 48 | 237.819815616 | 30.589038976 | SILUV | 1.56049116 | 106.035 |
| | 49 | 1105.595513606AS | 0.999299763 | | 1.00000000 | 100.156 |
| 25 | 50 | 86.934183491 | 45.380148828 | SILUV | 1.56049116 | 77.957 |
| | 51 | 170.242472558 AS | 0.997963011 | | 1.00000000 | 69.126 |
| 27 | 52 | 45.257566696 | 49.528196203 | SILUV | 1.56049116 | 43.217 |
| | 53 | ∞ | 1.974724574 | H2O | 1.43680000 | 12.491 |
| | 54 | ∞ | 0.000000000 | | 1.00000000 | 7.003 |

Aspherical Surfaces

| Surface 4 | Surface 6 | Surface 9 |
|---|---|---|
| K: 0.0000 | K: 0.0000 | K: 0.0000 |
| C1: 5.79209182e−008 | C1: −3.44646611e−007 | C1: −3.73442666e−007 |
| C2: −6.37791028e−013 | C2: 8.59385562e−011 | C2: 1.43445552e−011 |
| C3: 3.44372255e−016 | C3: −6.71616375e−014 | C3: −3.17190498e−015 |
| C4: −8.85599631e−020 | C4: 3.03855181e−017 | C4: −2.26702756e−020 |
| C5: 1.08570138e−023 | C5: −8.55350273e−021 | C5: 4.11927181e−023 |
| C6: −6.96227825e−028 | C6: 6.00036028e−025 | C6: −1.38156455e−026 |
| C7: 0.00000000e+000 | C7: 0.00000000e+000 | C7: 0.00000000e+000 |
| C8: 0.00000000e+000 | C8: 0.00000000e+000 | C8: 0.00000000e+000 |
| C9: 0.00000000e+000 | C9: 0.00000000e+000 | C9: 0.00000000e+000 |

| Surface 18 | Surface 22 | Surface 26 |
|---|---|---|
| K: 0.0000 | K: 0.0000 | K: 0.0000 |
| C1: 1.18777440e−006 | C1: 1.71075626e−007 | C1: −1.10154860e−007 |
| C2: 4.35580377e−010 | C2: −7.64005086e−012 | C2: 9.17734618e−012 |
| C3: 1.88404875e−013 | C3: 7.08908253e−016 | C3: 1.76187633e−014 |
| C4: 3.83721549e−017 | C4: −1.37311020e−019 | C4: −1.28147141e−016 |
| C5: 1.20493249e−020 | C5: 2.02367340e−023 | C5: 9.40704126e−020 |
| C6: 1.10378361e−023 | C6: −1.15655593e−027 | C6: −2.50493002e−023 |
| C7: 0.00000000e+000 | C7: 0.00000000e+000 | C7: 0.00000000e+000 |
| C8: 0.00000000e+000 | C8: 0.00000000e+000 | C8: 0.00000000e+000 |
| C9: 0.00000000e+000 | C9: 0.00000000e+000 | C9: 0.00000000e+000 |

| Surface 31 | Surface 35 | Surface 38 |
|---|---|---|
| K: 0.0000 | K: 0.0000 | K: 0.0000 |
| C1: 1.55330372e−007 | C1: −1.37333522e−006 | C1: −9.81476763e−007 |
| C2: 1.27330720e−011 | C2: −2.24444706e−010 | C2: 2.91363587e−011 |
| C3: −6.68035467e−016 | C3: 4.91877012e−014 | C3: 1.01744933e−014 |
| C4: −1.73835192e−019 | C4: 1.64123170e−017 | C4: −4.68579579e−018 |
| C5: 4.68772334e−025 | C5: 2.50741808e−020 | C5: 6.42028822e−022 |
| C6: 1.16194092e−027 | C6: −1.12492432e−023 | C6: −4.96400088e−026 |
| C7: 0.00000000e+000 | C7: 0.00000000e+000 | C7: 0.00000000e+000 |
| C8: 0.00000000e+000 | C8: 0.00000000e+000 | C8: 0.00000000e+000 |
| C9: 0.00000000e+000 | C9: 0.00000000e+000 | C9: 0.00000000e+000 |

| Surface 46 | Surface 49 | Surface 51 |
|---|---|---|
| K: 0.0000 | K: 0.0000 | K: 0.0000 |
| C1: 6.28883670e−009 | C1: 5.08335169e−008 | C1: −1.57589741e−007 |
| C2: −5.65369265e−014 | C2: −8.36178137e−013 | C2: 2.00244046e−011 |
| C3: 3.85725582e−017 | C3: 1.52685373e−017 | C3: −2.81721098e−015 |
| C4: 2.41064866e−022 | C4: −7.56691426e−021 | C4: 1.09133188e−018 |
| C5: −1.06036768e−025 | C5: −1.10112578e−024 | C5: −1.77818931e−022 |
| C6: 3.55992142e−030 | C6: 6.92008272e−029 | C6: 1.21644794e−026 |
| C7: 0.00000000e+000 | C7: 0.00000000e+000 | C7: 0.00000000e+000 |
| C8: 0.00000000e+000 | C8: 0.00000000e+000 | C8: 0.00000000e+000 |
| C9: 0.00000000e+000 | C9: 0.00000000e+000 | C9: 0.00000000e+000 |

The numerical aperture of this projection optical system at the first object is 0.16875, the numerical aperture (NA) at the intermediate image is 0.343875, and the numerical aperture (NA) at the second object is 1.35. An imaging magnification $\beta_1$ from the first object to the intermediate image is −0.49, and imaging magnification $\beta_2$ from the intermediate image to the second object is −0.25, such that a total magnification $\beta_1 \cdot \beta_2$ from the first object to the second object is 0.125.

Figure 4:
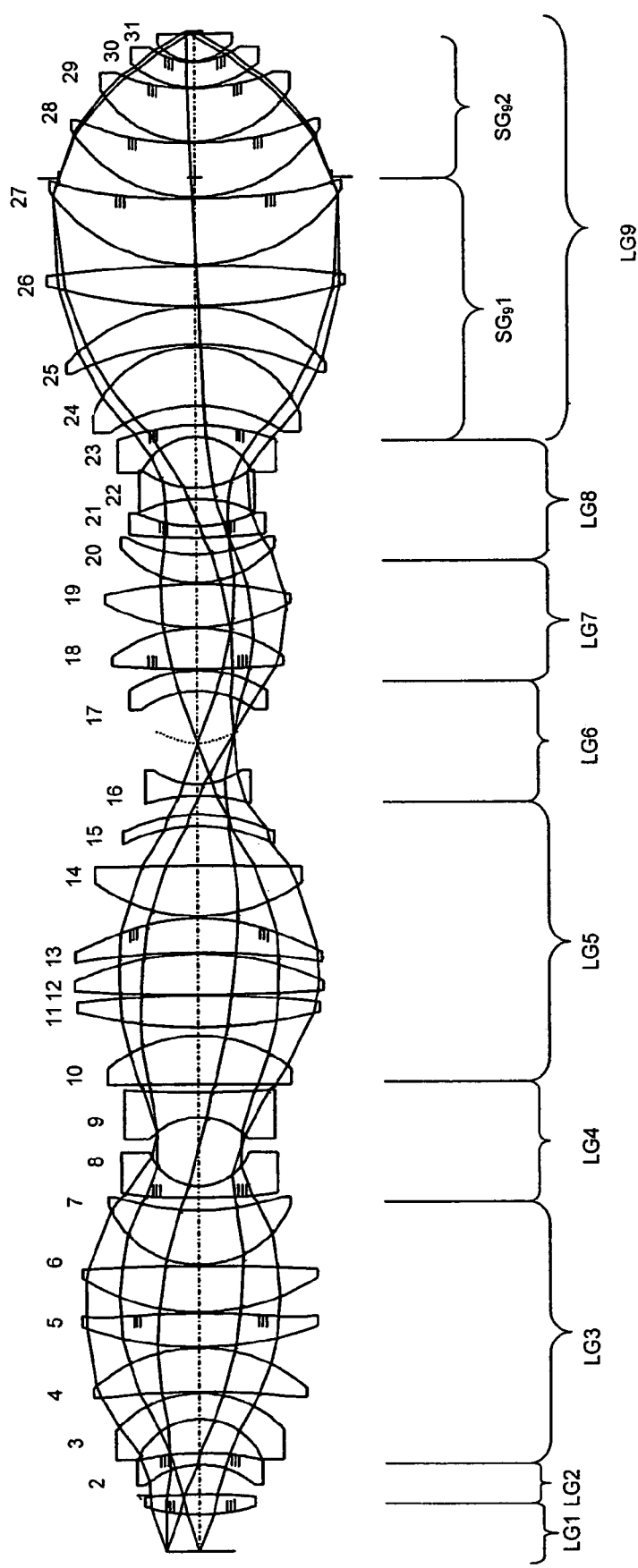
FIG. 4 is a schematic illustration of a fourth exemplary embodiment of a projection optical system according to the present invention.

FIG. 4 schematically illustrates a fourth exemplary embodiment of the projection optical system according to the present invention. Optical data of this projection optical system are given in Table 4 below.

TABLE 4

| Lens # | Surface | Radius | Thickness | Lens Material | Refractive Index | ½ Diameter |
|---|---|---|---|---|---|---|
| | 0 | ∞ | 32.0177 | | | 28.04 |
| 1 | 1 | 219.726108 | 16.9641 | SILUV | 1.56049116 | 40.832 |
| | 2 | −516.629235 | 25.5543 | | | 41.534 |
| 2 | 3 | −67.647606 | 9.9997 | SILUV | 1.56049116 | 42.327 |
| | 4 | −260.983067 | 29.1106 | | | 48.384 |
| 3 | 5 | −55.926810 | 22.2539 | SILUV | 1.56049116 | 49.734 |
| | 6 | −92.468456 | 0.9991 | | | 67.142 |
| 4 | 7 | −767.680932 | 37.5784 | SILUV | 1.56049116 | 82.094 |
| | 8 | −131.658929 | 0.9988 | | | 86.014 |
| 5 | 9 | 286.557516 | 28.7046 | SILUV | 1.56049116 | 94.284 |
| | 10 | −524.762011 | 0.9983 | | | 94.07 |
| 6 | 11 | 179.876647 | 39.2566 | SILUV | 1.56049116 | 94.422 |
| | 12 | −1720.456551 | 0.9987 | | | 92.365 |
| 7 | 13 | 81.367631 | 46.6132 | SILUV | 1.56049116 | 73.745 |
| | 14 | 214.457507 | 10.7815 | | | 65.879 |
| 8 | 15 | 988.155084 | 9.9989 | SILUV | 1.56049116 | 61.001 |
| | 16 | 44.128228 | 58.8087 | | | 39.687 |
| 9 | 17 | −54.499122 | 21.1959 | SILUV | 1.56049116 | 37.928 |
| | 18 | 779.716415 | 7.4192 | | | 58.019 |
| 10 | 19 | −2380.510542 | 41.7009 | SILUV | 1.56049116 | 63.429 |
| | 20 | −116.856539 | 7.1183 | | | 73.297 |
| 11 | 21 | 374.105752 | 27.3570 | SILUV | 1.56049116 | 95.272 |
| | 22 | −939.498386 | 0.9989 | | | 97.02 |
| 12 | 23 | 1698.857072 | 35.5054 | SILUV | 1.56049116 | 98.937 |
| | 24 | −232.675275 | 0.9998 | | | 100.079 |
| 13 | 25 | −637.737295 | 29.4950 | SILUV | 1.56049116 | 98.687 |
| | 26 | −154.955797 | 1.6682 | | | 98.696 |
| 14 | 27 | 143.644278 | 43.3863 | SILUV | 1.56049116 | 82.611 |
| | 28 | −4991.975215 | 33.6199 | | | 75.464 |
| 15 | 29 | −135.548808 | 10.0009 | SILUV | 1.56049116 | 58.898 |
| | 30 | −135.939439 | 15.7718 | | | 57.063 |
| 16 | 31 | −155.550081 | 9.9994 | SILUV | 1.56049116 | 39.631 |
| | 32 | 59.823981 | 34.9249 | | | 32.76 |
| | 33 | 40.944395 | 44.6217 | | | 30.661 |
| 17 | 34 | −78.015171 | 17.8868 | SILUV | 1.56049116 | 43.479 |
| | 35 | −103.229933 | 0.9990 | | | 53.465 |
| 18 | 36 | 748.407674 | 34.9736 | SILUV | 1.56049116 | 64.921 |
| | 37 | −114.726548 | 0.9986 | | | 68.235 |
| 19 | 38 | 155.876376 | 36.7930 | SILUV | 1.56049116 | 73.693 |
| | 39 | −322.561694 | 0.9993 | | | 72.589 |
| 20 | 40 | 82.043143 | 24.2651 | SILUV | 1.56049116 | 60.783 |
| | 41 | 123.218503 | 14.1941 | | | 55.017 |
| 21 | 42 | 501.513595 | 9.9987 | SILUV | 1.56049116 | 52.632 |
| | 43 | 108.394643 | 23.2241 | | | 45.918 |
| 22 | 44 | −108.072241 | 9.9973 | SILUV | 1.56049116 | 44.309 |
| | 45 | 75.853522 | 43.3152 | | | 42.433 |
| 23 | 46 | −49.580063 | 10.4777 | SILUV | 1.56049116 | 43.795 |
| | 47 | −135.624067 | 16.3741 | | | 61.989 |
| 24 | 48 | −127.749898 | 50.3510 | SILUV | 1.56049116 | 69.632 |
| | 49 | −93.339527 | 1.9988 | | | 84.556 |
| 25 | 50 | −230.459673 | 31.7216 | SILUV | 1.56049116 | 100.287 |
| | 51 | −145.921184 | 0.9986 | | | 105.092 |
| 26 | 52 | 438.084235 | 34.1859 | SILUV | 1.56049116 | 119.607 |
| | 53 | −958.216153 | 0.9985 | | | 119.996 |
| 27 | 54 | 148.780263 | 56.2561 | SILUV | 1.56049116 | 119.317 |
| | 55 | 1006.690104 | 17.5434 | | | 115.143 |
| | 56 | ∞ | −16.5440 | | | 113.484 |
| 28 | 57 | 121.754105 | 46.1167 | SILUV | 1.56049116 | 101.339 |
| | 58 | 364.980240 | 1.0000 | | | 94.888 |
| 29 | 59 | 92.745174 | 44.9633 | SILUV | 1.56049116 | 76.661 |
| | 60 | 162.095006 | 1.0000 | | | 61.07 |
| 30 | 61 | 79.550539 | 21.2760 | SILUV | 1.56049116 | 50.022 |
| | 62 | 52.213824 | 1.0000 | | | 33.7 |
| 31 | 63 | 38.877117 | 23.2198 | SILUV | 1.56049116 | 28.052 |
| | 64 | ∞ | 1.9981 | H2O | 1.43680000 | 11.206 |
| | 65 | ∞ | 0.0000 | | 0.00 | 7.01 |

| SRF | 1 | 4 | 10 | 15 | 26 |
|---|---|---|---|---|---|
| K | 0 | 0 | 0 | 0 | 0 |
| C1 | 4.949385E−07 | −3.024420E−08 | 6.269111E−08 | 1.261175E−07 | 8.504929E−08 |
| C2 | −4.367642E−11 | −5.916383E−11 | 1.324406E−12 | 8.971294E−12 | −7.030475E−14 |
| C3 | 4.465807E−14 | 5.552973E−15 | −4.683596E−17 | −3.260724E−15 | −2.810798E−17 |
| C4 | −8.750418E−18 | 6.922767E−19 | 7.650166E−21 | −8.196181E−20 | 9.597806E−21 |

TABLE 4-continued

| | | | | | |
|---|---|---|---|---|---|
| C5 | 2.122243E−21 | −2.973575E−22 | −5.793979E−25 | 1.052835E−22 | −4.197615E−25 |
| C6 | 3.823785E−25 | 1.235469E−25 | 1.724683E−29 | −1.037823E−26 | 1.026003E−29 |

| SRF | 33 | 36 | 43 | 47 | 55 |
|---|---|---|---|---|---|
| K | −4.00584 | 0 | 0 | 0 | 0 |
| C1 | 0.000000E+00 | −1.247396E−08 | −3.505754E−08 | 3.209461E−07 | 4.027043E−08 |
| C2 | 0.000000E+00 | 1.139915E−12 | −8.285113E−13 | −1.311727E−11 | −9.830902E−13 |
| C3 | 0.000000E+00 | −1.179022E−15 | −3.632752E−15 | −6.000578E−15 | 3.287892E−17 |
| C4 | 0.000000E+00 | 1.461992E−19 | −7.761827E−18 | 3.031884E−19 | 8.492315E−21 |
| C5 | 0.000000E+00 | −2.604272E−24 | 2.347772E−21 | 1.642062E−22 | −6.295963E−25 |
| C6 | 0.000000E+00 | −6.658674E−28 | −6.931183E−25 | −2.108137E−26 | 1.638768E−29 |

| SRF | 58 | 60 | 62 |
|---|---|---|---|
| K | 0 | 0 | 0 |
| C1 | 6.832442E−08 | −3.313614E−07 | −1.637842E−06 |
| C2 | 5.874159E−12 | 1.413471E−10 | −1.031046E−09 |
| C3 | −7.216686E−16 | −2.638118E−14 | 8.964353E−13 |
| C4 | −6.194479E−21 | 3.624962E−18 | 1.249258E−16 |
| C5 | 1.981698E−24 | −2.616814E−22 | −4.210636E−19 |
| C6 | −3.629080E−29 | 1.122394E−27 | 1.742133E−22 |

This projection optical system is designed to be operated with light of a wavelength of 193 nm and has a numerical aperture (NA) at the second object of 1.3. A distance between the first object and second object is 1300 mm. A diameter of the image field is 14.02 mm, and a RMS deviation of a wavefront at the second object is about 8.5 m$\lambda$.

A caustic of the intermediate image generated in the embodiments illustrated with reference to FIGS. 1, 2 and 3 above extends over plural lenses of the group LG7. Those lenses should be manufactured with a particularly high accuracy, in particular with respect to surface roughness and a homogeneity of the lens material.

Figure 5:
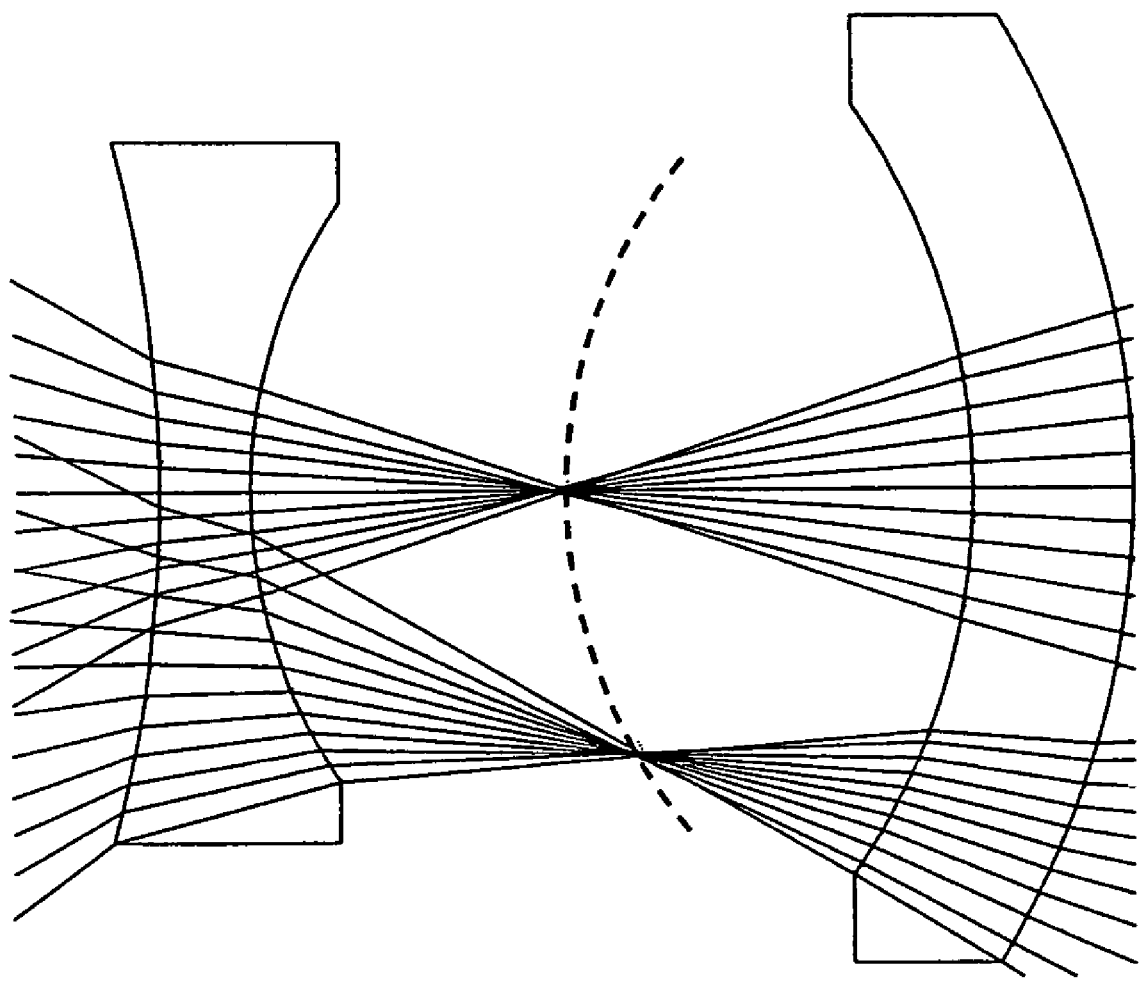
FIG. 5 shows a detail of FIG. 4.

In the embodiment shown in FIG. 4, the intermediate image is completely formed in a space between lens 16 and 17 as illustrated in the enlarged partial view of the projection optical system shown in FIG. 5. Thus, in this embodiment, the intermediate image is sufficiently corrected to be completely formed outside of lenses of the projection optical system, even though the intermediate image has a significant field curvature as indicated by a broken line in FIG. 5.

Summarized, a refractive projection optical system for imaging a first object into a region of a second object comprises a plurality of lenses disposed along an imaging beam path of the projection optical system; wherein the projection optical system is configured to have a numerical aperture on a side of the second object of greater than 1 wherein the projection optical system is configured to generate an intermediate image of the first object and to image the intermediate image into the region of the second object, wherein the intermediate image is formed in between the first and second objects.

While the invention has been described with respect to certain exemplary embodiments thereof, it is evident that many alternatives, modifications and variations will be apparent to those skilled in the art. Accordingly, the exemplary embodiments of the invention set forth herein are intended to be illustrative and not limiting in any way. Various changes may be made without departing from the spirit and scope of the present invention as defined in the following claims.

The invention claimed is:

1. A refractive projection optical system for imaging a first object into a region of a second object, the refractive projection optical system comprising:
   a plurality of lenses disposed along an imaging beam path of the refractive projection optical system,
   wherein the refractive projection optical system is configured to generate an intermediate image of the first object and to image the intermediate image into the region of the second object, wherein the intermediate image is formed in between the first and second objects,
   wherein the plurality of lenses is dividable into a plurality of non-overlapping groups of lenses, such that a total refractive power of each group of lenses is one of a negative refractive power or a positive refractive power,
   wherein a first group of lenses has a positive refractive power,
   wherein a second group of lenses has a positive refractive power and is disposed between the first group of lenses having the positive refractive power and the region of the second object, and
   wherein the intermediate image is formed in a region between the first group of lenses having the positive refractive power and the second group of lenses having the positive refractive power.

2. The refractive projection optical system according to claim 1, wherein one third group of lenses having a negative refractive power is disposed in the region between the first group of lenses having the positive refractive power and the second group of lenses having the positive refractive power.

3. The refractive projection optical system according to claim 2, wherein a fourth group of lenses having a negative refractive power is disposed between the second group of lenses having the positive refractive power and the region of the second object, and wherein a fifth group of lenses having a positive refractive power is disposed between the fourth group of lenses having the negative refractive power and the region of the second object.

4. The refractive projection optical system according to claim 3, wherein the fifth group of lenses is that group of lenses among all groups of lenses disposed closest to the second object.

5. The refractive projection optical system according to claim 1, wherein a sixth group of lenses having a negative refractive power is disposed between the first group of lenses having the positive refractive power and the first object, and wherein a seventh group of lenses having a positive refractive power is disposed between the sixth group of lenses having the negative refractive power and the first object.

6. The refractive projection optical system according to claim 5, wherein an eighth group of lenses having a negative refractive power is disposed between the seventh group of lenses having the positive refractive power and the first object,
wherein an ninth group of lenses having a positive refractive power is disposed between the eighth group of lenses having the negative refractive power and the first object, and
wherein the ninth group of lenses is that group of lenses among all groups of lenses disposed closest to the first object.

7. The refractive projection optical system according to claim 1, wherein the system further comprises at least one substantially flat mirror disposed in the imaging beam path of the optical system, for folding the beam path to reduce a length of the system.

8. The refractive projection optical system according to claim 7, wherein the substantially flat mirror has a radius of curvature greater than 1,000 m.

9. The refractive projection optical system according to claim 1, wherein an effective diameter of each lens of the plurality of lenses is smaller than 250 mm.

10. The refractive projection optical system according to claim 1, wherein the optical system is free of a physical beam splitter.

11. The refractive projection optical system according to claim 1, wherein the projection optical system is configured to have a numerical aperture on a side of the second object of greater than 1.

12. The refractive projection optical system according to claim 1, wherein the refractive projection optical system is of an immersion type configured to have a liquid having a refractive index of greater than one provided in between of the second object and a front lens of the plurality of lenses disposed closest to the second object.

13. A refractive projection optical system, for imaging a first object into a region of a second object, the refractive projection optical system comprising:
a plurality of lenses disposed along an imaging beam path of the refractive projection optical system,
wherein the refractive projection optical system is configured to generate an intermediate image of the first object and to image the intermediate image into the region of the second object, wherein the intermediate image is formed in between the first and second objects, and
wherein the projection optical system is configured to have a numerical aperture on a side of the second object of greater than 1.

14. The refractive projection optical system according to claim 13, wherein the refractive projection optical system is of an immersion type configured to have a liquid having a refractive index of greater than one provided in between of the second object and a front lens of the plurality of lenses disposed closest to the second object.

15. A refractive projection optical system, for imaging a first object into a region of a second object, the refractive projection optical system comprising:

a plurality of lenses disposed along an imaging beam path of the refractive projection optical system,
wherein the refractive projection optical system is configured to generate an intermediate image of the first object and to image the intermediate image into the region of the second object, wherein the intermediate image is formed in between the first and second objects, and
wherein an absolute value of a magnification of the imaging of the intermediate image into the region of the second object is less 0.5.

16. The refractive projection optical system according to claim 15, wherein an absolute value of a magnification of the imaging of the first object into the intermediate image is greater than 0.5.

17. The refractive projection optical system according to claim 15, wherein a ratio of a magnification of the imaging of the first object into the intermediate image over a magnification of the imaging of the intermediate image into the region of the second object is in a range of about 2 to 10.

18. A refractive projection optical system for imaging a first object into a region of a second object, the refractive projection optical system comprising:
a plurality of lenses disposed along an imaging beam path of the refractive projection optical system,
wherein the refractive projection optical system is configured to generate an intermediate image of the first object and to image the intermediate image into the region of the second object, wherein the intermediate image is formed in between the first and second objects,
wherein the imaging of the first object into the intermediate image is such that at least one of the following conditions is fulfilled:
an angle of at least one chief ray of the intermediate image is greater than 4°;
a longitudinal spherical aberration of the intermediate image is greater than 0.8 mm;
an astigmatism value of the intermediate image is greater than 11.0 mm;
an aberration of the intermediate image is greater than 1.5%;
a RMS of a spot diameter on an optical axis of the projection optical system is greater than 0.5 mm;
a RMS of a spot diameter at a field point farthest away from the optical axis of the projection optical system is greater than 5 mm; and
a RMS deviation of a wavefront at the intermediate image is greater than $10\lambda/NA$, wherein $\lambda$ is a wavelength of imaging light and NA is a numerical aperture of the imaging at the intermediate image.

19. The refractive projection optical system according to claim 18, wherein the projection optical system is configured to have a numerical aperture on a side of the second object of greater than 1.

20. The refractive projection optical system according to claim 18, wherein the refractive projection optical system is of an immersion type configured to have a liquid having a refractive index of greater than one provided in between of the second object and a front lens of the plurality of lenses disposed closest to the second object.

21. A refractive projection optical system for imaging a first object into a region of a second object, the refractive projection optical system comprising:
a plurality of lenses disposed alone an imaging beam path of the refractive projection optical system,
wherein the refractive projection optical system is configured to generate an intermediate image of the first object and to image the intermediate image into the region of the second object, wherein the intermediate image is formed in between the first and second objects, wherein the imaging of the first object into the second image is such that at least one of the following conditions is fulfilled:

an angle of at least one chief ray of the image is less than 1°;

a longitudinal spherical aberration of the image is less than 0.001 mm;

an astigmatism value of the image is less than 100 nm;

an aberration of the image is less than 0.001%;

a RMS of a spot diameter on an optical axis of the projection optical system is less than 0.001 mm;

a RMS of a spot diameter at a field point farthest away from the optical axis of the projection optical system is less than 0.002 mm; and a RMS deviation of a wave front is less than 0.1 times a diffraction limit.

22. The refractive projection optical system according to claim 21, wherein the projection optical system is configured to have a numerical aperture on a side of the second object of greater than 1.

23. The refractive projection optical system according to claim 21, wherein the refractive projection optical system is of an immersion type configured to have a liquid having a refractive index of greater than one provided in between of the second object and a front lens of the plurality of lenses disposed closest to the second object.

24. A refractive projection optical system, for imaging a first object into a region of a second object, the refractive projection optical system composing:

a plurality of lenses disposed along an imaging beam path of the refractive projection optical system, wherein the refractive projection optical system is configured to generate an intermediate image of the first object and to image the intermediate image into the region of the second object, wherein the intermediate image is formed in between the first and second objects, and wherein the intermediate image has a field curvature having a radius of curvature which is less than four times a free diameter of the intermediate image.

25. The refractive projection optical system according to claim 24, wherein the intermediate image is completely formed within a space between two adjacent lenses.

26. The refractive projection optical system according to claim 24, wherein the projection optical system is configured to have a numerical aperture on a side of the second object of greater than 1.

27. The refractive projection optical system according to claim 24, wherein the refractive projection optical system is of an immersion type configured to have a liquid having a refractive index of greater than one provided in between of the second object and a front lens of the plurality of lenses disposed closest to the second object.

28. A projection exposure system, comprising:

an illumination optical system for generating an illumination beam of light;

a first mount for mounting a patterning structure as a first object within the illumination beam of light;

a second mount for mounting a radiation sensitive substrate as a second object; and the refractive projection optical system according to one of claims 1, 13, 15, 18, 21 and 24 for imaging the first object into a region of the second object using a portion of the illumination beam of light traversing the patterning structure.

29. A method of manufacturing a microstructured device, comprising:

a first imaging of a patterning structure into an intermediate image of the patterning structure; and a second imaging of the intermediate image of the pattering structure into a region of a radiation sensitive substrate for exposing the radiation sensitive substrate, wherein the first imaging and the second imaging are performed by using a refractive projection optical system, and wherein the first imaging comprises:

a first expanding of a cross section of an imaging beam downstream of the patterning structure;

a first reducing of the cross section of the imaging beam downstream of the first expanding of the cross section;

a second expanding of the cross section of the imaging beam downstream of the first reducing of the cross section;

a second reducing of the cross section of the imaging beam downstream of the second expanding of the cross section;

a third expanding of the cross section of the imaging beam downstream of the second reducing of the cross section; and a third reducing of the cross section of the imaging beam downstream of the third expanding of the cross section.

30. The method according to claim 29, wherein the second imaging comprises:

a fourth expanding of the cross section of the imaging beam downstream of the intermediate image;

a fourth reducing of the cross section of the imaging beam downstream of the fourth expanding of the cross section;

a fifth expanding of the cross section of the imaging beam downstream of the fourth reducing of the cross section; and a fifth reducing of the cross section of the imaging beam downstream of the fifth expanding of the cross section;

wherein the imaging beam is incident onto the radiation sensitive substrate downstream of the second reducing of the cross section.

31. The method according to claim 29, wherein the second imaging has a numerical aperture on a side of the radiation sensitive substrate of greater than 1.

32. The method according to claim 29, further comprising providing a liquid in a space between the radiation sensitive substrate and a lens of the refractive projection optical system closest to the radiation sensitive substrate.

33. A method of manufacturing a microstructured device, comprising:

a first imaging of a patterning structure into an intermediate image of the patterning structure; and a second imaging of the intermediate image of the patterning structure into a region of a radiation sensitive substrate for exposing the radiation sensitive substrate, wherein the first imaging and the second imaging are performed by using a refractive projection optical system, and wherein the second imaging has a numerical aperture on a side of the radiation sensitive substrate of greater than 1.

34. The method according to claim 33, further comprising providing a liquid in a space between the radiation sensitive substrate and a lens of the refractive projection optical system closest to the radiation sensitive substrate.

35. A method of manufacturing a microstructured device, comprising:
- a first imaging of a patterning structure into an intermediate image of the patterning structure; and
- a second imaging of the intermediate image of the patterning structure into a region of a radiation sensitive substrate for exposing the radiation sensitive substrate,
- wherein the first imaging and the second imaging are performed by using a refractive projection optical system, and
- wherein the first imaging is performed such that at least one of the following conditions is fulfilled:
- an angle of at least one chief ray of the intermediate image is greater than 4°;
- a longitudinal spherical aberration of the intermediate image is greater than 0.8 mm;
- an astigmatism value of the intermediate image is greater than 11.0 mm;
- an aberration of the intermediate image is greater than 1.5%;
- a RMS of a spot diameter on an optical axis of the projection optical system is greater than 0.5 mm;
- a RMS of a spot diameter at a field point farthest away from the optical axis of the projection optical system is greater than 5 mm; and
- a RMS deviation of a wavefront at the intermediate image is greater than $10\lambda/NA$, wherein $\lambda$ is a wavelength of imaging light and NA is a numerical aperture of the imaging at the intermediate image.

36. The method according to claim 35, wherein the second imaging has a numerical aperture on a side of the radiation sensitive substrate of greater than 1.

37. The method according to claim 35, further comprising providing a liquid in a space between the radiation sensitive substrate and a lens of the refractive projection optical system closest to the radiation sensitive substrate.

38. A method of manufacturing a microstructured device, comprising:
- a first imaging of a patterning structure into an intermediate image of the patterning structure; and
- a second imaging of the intermediate image of the patterning structure into a region of a radiation sensitive substrate for exposing the radiation sensitive substrate,
- wherein the first imaging and the second imaging are performed by using a refractive projection optical system, and
- wherein the first imaging is performed such that at least one of the following conditions is fulfilled:
- an angle of at least one chief ray of the image is less than 1°;
- a longitudinal spherical aberration of:the image is less than 0.001 mm;
- an astigmatism value of the image is less than 100 nm;
- an aberration of the image is less than 0.001%;
- a RMS of a spot diameter on an optical axis of the projection optical system is less than 0.001 mm;
- a RMS of a spot diameter at a field point farthest away from the optical axis of the projection optical system is less than 0.002 mm;
- and a RMS deviation of a wave front is less than 0.1 times a diffraction limit.

39. The method according to claim 38, wherein the second imaging has a numerical aperture on a side of the radiation sensitive substrate of greater than 1.

40. The method according to claim 38, further comprising providing a liquid in a space between the radiation sensitive substrate and a lens of the refractive projection optical system closest to the radiation sensitive substrate.

* * * * *

UNITED STATES PATENT AND TRADEMARK OFFICE
CERTIFICATE OF CORRECTION

| | | |
|---|---|---|
| PATENT NO. | : 7,301,707 B2 | Page 1 of 1 |
| APPLICATION NO. | : 11/219594 | |
| DATED | : November 27, 2007 | |
| INVENTOR(S) | : Shafer et al. | |

It is certified that error appears in the above-identified patent and that said Letters Patent is hereby corrected as shown below:

In column 26, line 64, delete "a plurality of lenses disposed alone an imaging beam path" and insert --a plurality of lenses disposed along an imaging beam path--.

Signed and Sealed this

Twenty-second Day of July, 2008

JON W. DUDAS
*Director of the United States Patent and Trademark Office*